(12) United States Patent
Tateiwa

(10) Patent No.: US 7,638,395 B2
(45) Date of Patent: Dec. 29, 2009

(54) SEMICONDUCTOR DEVICE FABRICATING METHOD

(75) Inventor: Kenji Tateiwa, Kadoma (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/116,051

(22) Filed: May 6, 2008

(65) Prior Publication Data

US 2009/0017608 A1 Jan. 15, 2009

Related U.S. Application Data

(60) Provisional application No. 60/949,353, filed on Jul. 12, 2007.

(51) Int. Cl.
*H01L 21/336* (2006.01)
(52) U.S. Cl. .............. 438/270; 438/195; 438/259; 438/275; 257/E21.37; 257/E21.384; 257/E21.428
(58) Field of Classification Search .......... 438/156, 438/176, 195, 206; 257/E21.016, E21.159, 257/E21.37, E21.4, E21.428, E21.457
See application file for complete search history.

(56) References Cited

U.S. PATENT DOCUMENTS

2004/0191974 A1 9/2004 Gilmer et al.

2006/0046523 A1* 3/2006 Kavalieros et al. .......... 438/791
2008/0173946 A1* 7/2008 Zhu et al. .................... 257/369

OTHER PUBLICATIONS

Lai, C.S. et al., "Effects of Post $CF_4$ Plasma Treatment on the $HfO_2$ Thin Film," Japanese Journal of Applied Physics, Vo. 44, No. 4B, 2005, pp. 2307-2310.

* cited by examiner

*Primary Examiner*—Savitri Mulpuri
*Assistant Examiner*—Cheung Lee
(74) *Attorney, Agent, or Firm*—McDermott Will & Emery LLP

(57) ABSTRACT

A method for fabricating a semiconductor device is provided which has first and second regions, transistors of different conductivity types being formed on parts of a substrate corresponding to the first and second regions. The method includeujs the steps of: (a) forming a first insulating film to cover the parts of the substrate corresponding to the first and second regions; (b) forming a first thin film on the first insulating film, the first thin film having a relatively higher etching rate than the first insulating film in plasma etching using a halogen gas; and (c) removing a part of the first thin film corresponding to the first region by the plasma etching using a mask covering the second region and modifying a part of the first insulating film corresponding to the first region.

14 Claims, 17 Drawing Sheets

SEMICONDUCTOR DEVICE FABRICATING METHOD

RELATED APPLICATIONS

This present application claims priority to U.S. Application No. 60/949,353, filed Jul. 12, 2007, the disclosure of which is incorporated by reference herein.

BACKGROUND OF THE INVENTION (1) Field of the Invention

The present invention relates to methods for fabricating a semiconductor device, and more particularly relates to a method for forming gate stacks including gate electrodes of an N-channel transistor and a P-channel transistor having separate work functions.

(2) Description of Related Art

In recent years, with increases in degree of integration, functionality and operating speed of semiconductor integrated circuit devices, a technology has been suggested in which a high-k insulating film (a high dielectric insulating film) having a higher dielectric constant than $SiO_2$ is used as a gate insulating film.

Use of a high-k insulating film as a gate insulating film permits the formation of a relatively thick gate insulating film while a high electric field is applied below a gate. This can reduce the gate leakage current.

However, when a high-k insulating film is used as a gate insulating film and a conventionally used polysilicon electrode is used as an electrode to be formed on the gate insulating film, the threshold voltage Vt is disadvantageously increased due to a phenomenon called Fermi level pinning. Furthermore, when polysilicon is used as a material of a gate electrode, the gate capacity is reduced due to a gate depletion phenomenon. Thus, a high electric field cannot be applied below the gate, resulting in a reduction in the driving capability of a transistor.

To cope with the above, a technology has been suggested in which, instead of conventionally used polysilicon, a metal gate is used as a gate electrode. When a metal gate is used instead of polysilicon, the metal gate needs to have an independent work function for an associated one of an N-channel transistor and a P-channel transistor. To satisfy the need, a material suitable for the polarity of each transistor needs to be used. A different process flow from that when polysilicon is used is required.

A known fabrication method for a semiconductor device in which a metal gate and a high-k insulating film are used as a gate electrode and a gate insulating film, respectively, will be described hereinafter with reference to the drawings.

FIGS. 15A through 15D, 16A through 16D, and 17A and 17B are cross-sectional views for explaining essential process steps in a known fabrication method for a semiconductor device in a sequential order. It is assumed that in each figure, the left half region of the cross-sectional view when viewed from the front of the paper is an N-channel transistor formation region A and the right half region of the cross-sectional view when viewed from the front of the paper is a P-channel transistor formation region B.

As shown in FIG. 15A, a shallow trench isolation (STI) region 2 is formed in a silicon substrate 1 to define element formation regions, and then a high-k insulating film 3 is formed to cover the silicon substrate 1 and the STI region 2. Subsequently, a silicon dioxide film ($SiO_2$) 4 serving as a sacrificial layer is formed on the high-k insulating film 3.

Next, a resist pattern 5 is formed to cover a region of the silicon dioxide film 4 corresponding to the N-channel transistor formation region A.

Next, as shown in FIG. 15B, the silicon dioxide film 4 is partially etched away by wet etching using the resist pattern 5 as a mask without etching the underlying high-k insulating film 3. Subsequently, the resist pattern 5 is removed.

Next, as shown in FIG. 15C, a metal film 6 having a work function close to the band edge of a P-channel transistor is deposited on the entire silicon substrate 1 region.

Next, as shown in FIG. 15D, a resist pattern 7 is formed to cover a region of the metal film 6 corresponding to the P-channel transistor formation region B.

Next, as shown in FIG. 16A, the metal film 6 is partially etched away using the resist pattern 7 as a mask.

Next, as shown in FIG. 16B, the resist pattern 7 is removed, and then the silicon dioxide film 4 is further removed by wet etching.

Next, as shown in FIG. 16C, a metal film 8 is deposited to cover the high-k insulating film 3 and the metal film 6.

Next, as shown in FIG. 16D, resist patterns 9 are formed on both the N-channel transistor formation region A and the P-channel transistor formation region B to form gate patterns.

Next, as shown in FIG. 17A, the metal films 6 and 8 are partially removed by etching using the resist patterns 9.

Next, as shown in FIG. 17B, after the resist patterns 9 are removed, a gate pattern formed of one of the remaining parts of the metal film 8 is formed on the N-channel transistor formation region A, and a gate pattern formed of the remaining part of the metal film 6 and the other remaining part of the metal film 8 is formed on the P-channel transistor formation region B.

As described above, according to the known fabrication method for a semiconductor device, a dual metal gate structure is formed through the above-mentioned process steps.

Meanwhile, according to the known fabrication method for a semiconductor device, as described above with reference to FIG. 15B, the silicon dioxide film 4 serving as a sacrificial layer is removed by wet etching. Therefore, a photoresist to be used is limited, and thus it is difficult to control the positioning of the border between the N-channel transistor formation region A and the P-channel transistor formation region B. Furthermore, since it is difficult to selectively remove the silicon dioxide film 4 on the high-k insulating film 3, damage is more likely to be caused to the high-k insulating film 3 serving as an underlayer for the silicon dioxide film 4.

Furthermore, as shown in FIG. 17B, the gate pattern formed on the N-channel transistor formation region A and formed of the part of the metal film 8 and the gate pattern formed on the P-channel transistor formation region B and formed of the part of the metal film 6 and the part of the metal film 8 have different heights. For this reason, the size of each channel transistor is hardly controlled with accuracy without causing damage to the gate insulating film 3 serving as an underlayer for etching.

SUMMARY OF THE INVENTION

In view of the above, an object of the present invention is to provide a semiconductor device which is excellent in terms of the controllability of the positioning of the border between an N-channel transistor and a P-channel transistor and achieves such a structure that the heights of gate patterns of the N-channel transistor and the P-channel transistor are as equal as possible while suppressing an increase in the number of process steps to a minimum and a fabrication method for the same.

In order to achieve the above-described object, a semiconductor device fabricating method in accordance with a first aspect of the present invention is a method for fabricating a semiconductor device having first and second regions, transistors of different conductivity types being formed on parts of a substrate corresponding to the first and second regions, which includes the steps of: (a) forming a first insulating film to cover the parts of the substrate corresponding to the first and second regions; (b) forming a first thin film on the first insulating film, the first thin film having a relatively higher etching rate than the first insulating film in plasma etching using a halogen gas; and (c) removing a part of the first thin film corresponding to the first region by the plasma etching using a mask covering the second region and modifying a part of the first insulating film corresponding to the first region.

A semiconductor device fabricating method in accordance with a second aspect of the present invention is a method for fabricating a semiconductor device having first and second regions, transistors of different conductivity types being formed on parts of a substrate corresponding to the first and second regions, which includes the steps of: (a) forming a first insulating film to cover the parts of the substrate corresponding to the first and second regions; (b) forming a first thin film on the first insulating film; (c) removing parts of the first thin film and first insulating film both corresponding to the first region by etching using a mask covering the second region; (d) forming a second insulating film to cover the part of the substrate corresponding to the first region and a part of the first thin film corresponding to the second region; (e) forming a first metal film having a first work function to cover the second insulating film; (f) forming a second thin film having a relatively higher etching rate than the first metal film to cover the first metal film; (g) removing a part of the second thin film corresponding to the second region by etching using a mask covering the first region; (h) after the step (g), removing a part of the first metal film corresponding to the second region by etching using the mask covering the first region; (i) after the step (h), removing a part of the second insulating film corresponding to the second region by etching using the mask covering the first region; (j) after the step (i), removing a part of the first thin film corresponding to the second region by etching using the mask covering the first region; (k) after the step (j), removing a part of the first insulating film corresponding to the second region by etching the mask covering the first region; (l) after the step (k), forming a third insulating film to cover a part of the first thin film corresponding to the first region and the part of the substrate corresponding to the second region; (m) forming a second metal film having a second work function to cover the third insulating film; (n) removing a part of the second metal film corresponding to the first region by etching using a mask covering the second region; and (o) after the step (n), removing a part of the third insulating film corresponding to the first region by etching using the mask covering the second region.

A semiconductor device fabricating method in accordance with still a third aspect of the present invention is a method for fabricating a semiconductor device having first and second regions, transistors of different conductivity types being formed on parts of a substrate corresponding to the first and second regions, which includes the steps of: (a) forming a first insulating film to cover the parts of the substrate corresponding to the first and second regions; (b) forming a first thin film on the first insulating film, the first thin film having a relatively higher etching rate than the first insulating film in plasma etching using a halogen gas; and (c) removing parts of the first thin film and first insulating film both corresponding to the first region by etching using a mask covering the second region; (d) forming a second insulating film to cover the part of the substrate corresponding to the first region and a part of the first thin film corresponding to the second region; (e) forming a first metal film having a first work function to cover the second insulating film; (f) removing respective parts of the first metal film and the second insulating film corresponding to the second region by etching using a mask covering the first region; (g) after the step (f), removing a part of the first thin film corresponding to the second region by the plasma etching using the mask covering the first region and modifying a part of the first insulating film corresponding to the second region; and (h) forming a second metal film having a second work function to cover a part of the first insulating film corresponding to the second region.

A semiconductor device fabricating method in accordance with a fourth aspect of the present invention is a method for fabricating a semiconductor device having first and second regions, transistors of different conductivity types being formed on parts of a substrate corresponding to the first and second regions, which includes the steps of: (a) forming first thin films on the inside of a first gate formation trench corresponding to the first region, formed at the bottom with a first insulating film and the inside of a second gate formation trench corresponding to the second region, formed at the bottom with another first insulating film, the first thin films having a relatively higher etching rate than the first insulating films in plasma etching using a halogen gas; (b) removing one of the first thin films corresponding to the first region by the plasma etching using a mask covering the second region to expose the associated first insulating film at the first gate formation trench and modifying the first insulating film; (c) after the step (b), forming a first metal film having a first work function to cover the first region including the inside of the first gate formation trench and the second region; (d) after the step (c), removing a part of the first metal film corresponding to the second region by etching using a mask covering the first region; (e) after the step (d), removing the other first thin film corresponding to the second region by the plasma etching using the mask covering the first region to expose the associated first insulating film at the second gate formation trench and modifying the first insulating film; and (f) after the step (e), forming a second metal film having a second work function to cover the second region including the inside of the second gate formation trench.

A semiconductor device fabricating method in accordance with a fifth aspect of the present invention is a method for fabricating a semiconductor device having first and second regions, transistors of different conductivity types being formed on parts of a substrate corresponding to the first and second regions, which includes the steps of: (a) forming first and second gate formation trenches exposing parts of the substrate in parts corresponding to the first and second regions, respectively; (b) after the step (a), forming a second gate insulating film to cover the first region including the inside of the first gate formation trench and the second region including the inside of the second gate formation trench, forming a second thin film having a relatively higher etching rate than the second insulating film in plasma etching using a halogen gas to cover the second gate insulating film, and then partially leaving the second thin film only inside the first and second gate formation trenches; (c) after the step (b), removing the left part of the second thin film in the first gate formation trench by the plasma etching and modifying a part of the second insulating film inside the first gate formation trench; (d) after the step (c), forming a first metal film having a first work function to cover the first region including the inside of the first gate formation trench and the second region; (e) after the step (d), removing a part of the first metal film corresponding to the second region by etching using a mask covering the first region; (f) after the step (e), removing the left part of the second thin film in the second gate formation trench by the plasma etching using the mask covering the first region and modifying a part of the second insulating film inside the second gate formation trench; and (g) after the step (f), forming a second metal film having a second work function to cover the second region including the inside of the second gate formation trench.

DETAILED DESCRIPTION OF THE INVENTION

A method for fabricating a semiconductor device according to one aspect of the present invention includes the steps of, in order to selectively etch a metal film, forming an amorphous silicon layer (hereinafter, referred to as an "a-Si layer") as a buffer layer under the metal film and removing the a-Si layer by plasma etching. The method further includes the step of improving the quality of a high-k insulating film while, in overetching for the removal of the a-Si layer, damage to the high-k insulating film is suppressed to a minimum by reducing the bias voltage. The above-described process is used for both an N-channel transistor formation region and a P-channel transistor formation region.

Since the method appropriately includes the above-described process steps, a CMOS device which exhibits excellent size controllability and whose gate oxide film has excellent characteristics can be achieved for both the N-channel transistor formation region and the P-channel transistor formation region.

Effects brought by the method according to the aspect of the present invention includes the following effects: A metal gate process with excellent reliability can be created without causing damage to a gate insulating film formed of the high-k insulating film; and in addition, high gate size controllability is achieved.

In another aspect of the present invention, polysilicon is formed on an insulating film made of a high-k film on a substrate. When the polysilicon film is etched, it is subjected to a low bias process using a halogen gas. In this way, metal electrodes of an N-channel transistor and a P-channel transistor having separate work functions are formed while the quality of the underlying high-k film is improved.

EMBODIMENT 1

A fabrication method for a semiconductor device according to a first embodiment of the present invention will be described hereinafter with reference to the drawings.

FIGS. 1A through 1D, 2A through 2D, and 3A and 3B are cross-sectional views for explaining essential process steps in the fabrication method for a semiconductor device according to the first embodiment of the present invention in a sequential order. It is assumed that in each figure, the left half region of the cross-sectional view when viewed from the front of the paper is a P-channel transistor formation region A and the right half region of the cross-sectional view when viewed from the front of the paper is an N-channel transistor formation region B.

Figure 1A:
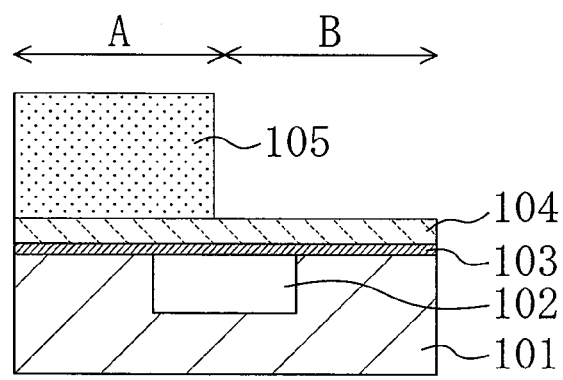
FIGS. 1A through 1D are cross-sectional views illustrating essential process steps in a fabrication method for a semiconductor device according to a first embodiment of the present invention in a sequential order.

First, as shown in FIG. 1A, a shallow trench isolation (STI) region 102 is formed in a silicon substrate 101 to define active element formation regions, and then a high-k insulating film 103 made of, for example, $HfO_x$ is formed to cover the silicon substrate 101 and the STI region 102. Subsequently, an a-Si layer 104 is formed on the high-k insulating film 103. Next, a resist pattern 105 is formed to cover a predetermined region of the a-Si layer 104, for example, the P-channel transistor formation region A.

Figure 1B:
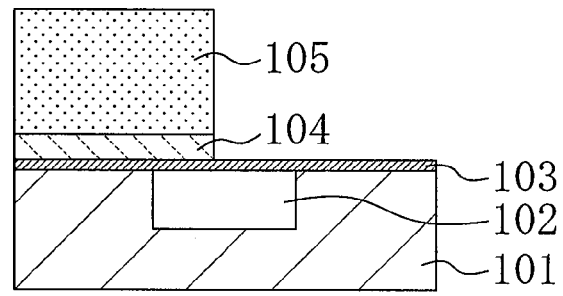

Next, as shown in FIG. 1B, the a-Si layer 104 is partially etched away by dry etching using the resist pattern 105 as a mask at a relatively higher etching rate than that with respective to the underlying high-k insulating film 103. In this etching, in order to prevent the underlying high-k insulating film 103 from being etched, the bias power applied to the silicon substrate 101 in this etching is reduced to a sufficiently low value by the time when at least the high-k insulating film 103 is exposed. More specifically, the peak-to-peak voltage Vpp of the bias power is preferably 100 V or less and furthermore more preferably 50 V or less. It is further preferable to set the RF voltage at 0 V (bias voltage=0 V). Moreover, a gas for use in this etching may be a halogen gas, i.e., either a fluorine gas, such as $CF_4$ or $SF_6$, a chlorine gas, such as $Cl_2$ or HCl, or a bromine gas, such as HBr. Since, under such conditions, the a-Si layer 104 is subjected to etching, only the a-Si layer 104 is partially etched away, and the underlying high-k insulating film 103 is hardly etched. Furthermore, it has been known that the quality of a high-k insulating film can be improved by plasma treatment using a halogen gas (for example, C. S. Lai et al., JJAP 2005, Vol. 44, pp 2307-). In this embodiment, plasma treatment using a halogen gas is performed simultaneously with etching for polysilicon, thereby achieving excellent size controllability and the effect of improving the film quality at the same time.

Figure 1C:
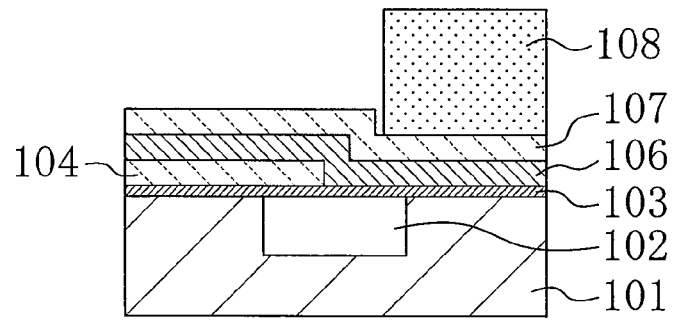

Next, as shown in FIG. 1C, the resist pattern 105 is separated from the a-Si layer 104, and then a metal film 106 and an a-Si layer 107 are deposited on the entire substrate region. Then, a resist pattern 108 is formed to cover a predetermined region of the a-Si layer 107, i.e., the N-channel transistor formation region B. A metal having a work function close to the energy of the conduction band (CB) of silicon (CB−100 mV±300 mV) is used as the metal film 106. Furthermore, this work function of the metal is more preferably CB−100 mV±200 mV.

Figure 1D:
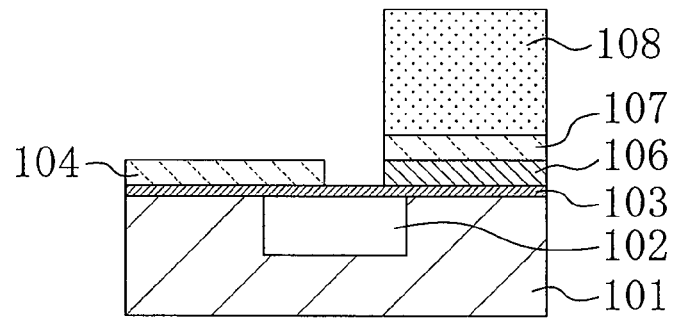

Next, as shown in FIG. 1D, the a-Si layer 107 and the metal film 106 are etched using the resist pattern 108 as a mask.

Figure 2A:
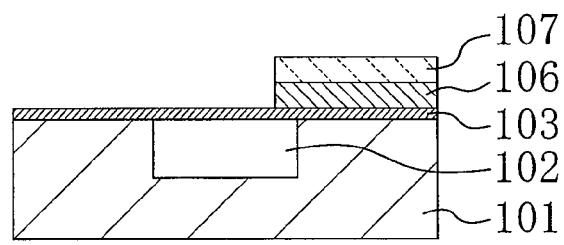
FIGS. 2A through 2D are cross-sectional views illustrating other essential process steps in the fabrication method for a semiconductor device according to the first embodiment of the present invention in a sequential order.

Next, as shown in FIG. 2A, the a-Si layer 104 is etched away using the resist pattern 108 as a mask. For this etching, a halogen gas is used under a low bias like the above-described etching method in FIG. 1B. Thus, while the size controllability is maintained, the quality of the underlying high-k insulating film 103 is improved. Thereafter, the resist pattern 108 is separated from the a-Si layer 107.

Figure 2B:
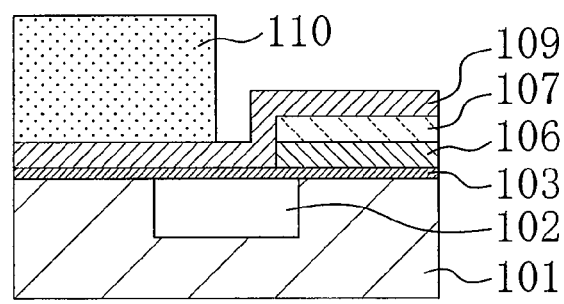

Next, as shown in FIG. 2B, the metal film 109 is deposited on the entire silicon substrate 101 region, and then a resist pattern 110 is formed to cover the P-channel transistor formation region A. A metal having a work function close to the energy of the valence band (VB) of silicon (VB+100 mV±300 mV) is used as the metal film 106. Furthermore, this work function of the metal is more preferably VB+100 mV±200 mV.

Figure 2C:
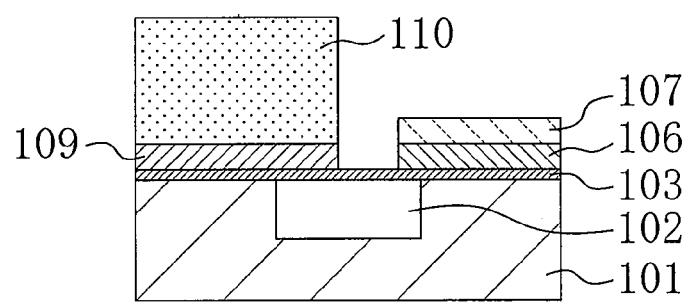

Next, as shown in FIG. 2C, the metal film 109 is partially etched away using the resist pattern 110 as a mask.

Figure 2D:
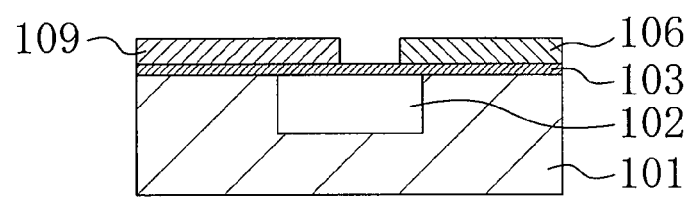

Next, as shown in FIG. 2D, the a-Si layer 107 is etched away using the resist pattern 110 as a mask, and then the resist pattern 110 is removed.

In this process step, the thicknesses of the deposited metal films 106 and 109, the amount of the metal film 106 overetched, and other elements are adjusted such that immediately after completion of this process step, the difference in height between the P-channel transistor formation region A and the N-channel transistor formation region B becomes 10 nm or less.

Figure 3A:
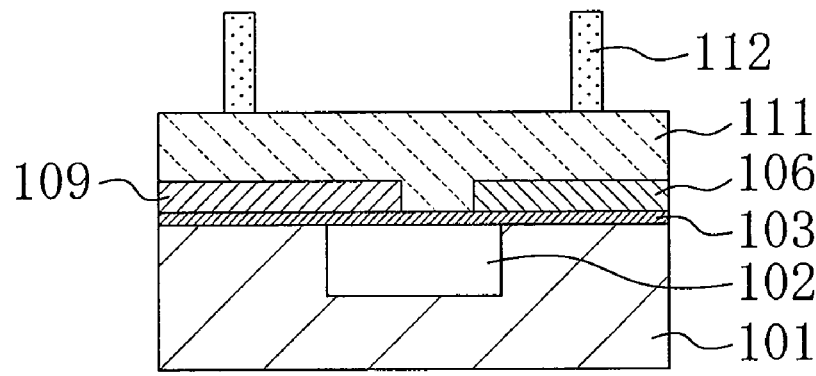
FIGS. 3A and 3B are cross-sectional views illustrating still other essential process steps in the fabrication method for a semiconductor device according to the first embodiment of the present invention in a sequential order.

Next, as shown in FIG. 3A, an a-Si layer 111 is deposited on the entire substrate region, and then resist patterns 112 for forming gate patterns are formed on the P-channel transistor formation region A and the N-channel transistor formation region B.

Figure 3B:
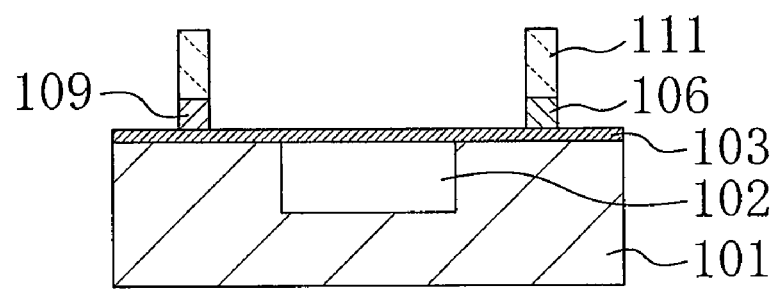

Next, as shown in FIG. 3B, the a-Si layer 111 and the metal films 109 and 106 are etched using the resist patterns 112 as masks, and then the resist patterns 112 are removed. In this way, a dual metal gate structure in which each of gates has a work function suitable for an associated one of the P-channel transistor formation region A and the N-channel transistor formation region B is completed.

As described above, the fabrication method for a semiconductor device according to the first embodiment of the present invention facilitates the processing of the entire substrate region on the P-channel transistor formation region A and the N-channel transistor formation region B other than gate patterning. Furthermore, while use of dry etching allows the accuracy of the controllability over the positioning of the border between the N-channel transistor formation region A and the P-channel transistor formation region B to be maintained, the quality of the underlying high-k insulating film 103 is improved. In addition, the adjustment of the thicknesses of the metal films 106 and 109 permits control over the heights of the P-channel transistor formation region A and the N-channel transistor formation region B.

In this embodiment, the process flow in which the mask covering the P-channel transistor formation region A is initially used was described. However, the inverted process flow in which the mask covering the N-channel transistor formation region B is initially used may be executed.

In this embodiment, instead of the a-Si layer 111, a Si (amorphous silicon or polysilicon) layer doped with P or any other element may be used. Furthermore, any other conductive material, such as tungsten, may be used. Likewise, instead of the a-Si layers 104 and 107, an a-Si layer doped with P or any other element or a polysilicon layer doped therewith may be used. Furthermore, any film that can ensure a higher etching selectivity than a $SiO_2$ film (or a high-k insulating film) deposited at 600° C. or less by halogen plasma, such as p-SiN, may be used likewise.

In this embodiment, it is better to form an interface layer made of $SiO_2$, SiON or any other material under the high-k insulating film 103.

Furthermore, in this embodiment, the high-k insulating film 103 is composed of an oxide, a silicate film or an oxynitride containing at least one from the group consisting of Hf, La, Al, Zr, Ta, Ti, Ba, Sr, Pb, and Sc. Alternatively, it may be composed of a layered film of these materials.

In this embodiment, the metal films 106 and 109 are each composed of one selected from the group consisting of Hf, Zr, Ti, Ta, Al, Ru, Pd, Pt, Co, Ni, Mo, and La, a compound of these materials and Si, N, O, or C, or a complex compound.

Moreover, in this embodiment, the thickness and the like of the meal films 106 and 109 are adjusted so that the difference in height between the P-channel transistor formation region A and the N-channel transistor formation region B becomes 10 nm or less. Alternatively, in the case where difference in etching rate between the region A and the region B is observed in gate processing etching for forming the transistors, the heights may be changed within the range capable of correcting the difference.

EMBODIMENT 2

A fabrication method for a semiconductor device according to a second embodiment of the present invention will be described hereinafter with reference to the drawings.

FIGS. 4A through 4D, 5A through 5D, 6A through 6D, and 7 are cross-sectional views for explaining essential process steps in the fabrication method for a semiconductor device according to the second embodiment of the present invention in a sequential order. It is assumed that in each figure, the left half region of the cross-sectional view when viewed from the front of the paper is a P-channel transistor formation region A and the right half region of the cross-sectional view when viewed from the front of the paper is an N-channel transistor formation region B.

Figure 4A:
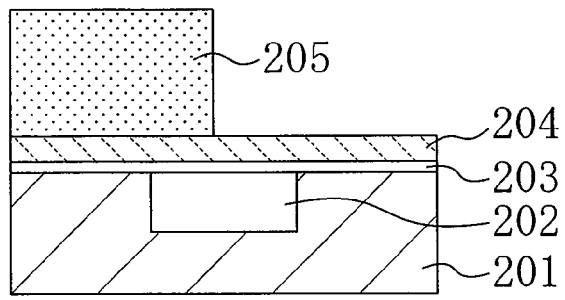
FIGS. 4A through 4D are cross-sectional views illustrating essential process steps in a fabrication method for a semiconductor device according to a second embodiment of the present invention in a sequential order.

First, as shown in FIG. 4A, a shallow trench isolation (STI) region 202 is formed in a silicon substrate 201 to define element formation regions, and then an insulating film 203 made of, for example, $SiO_x$ is formed to cover the silicon substrate 201 and the STI region 202. Subsequently, an a-Si layer 204 is formed on the insulating film 203. Next, a resist pattern 205 is formed to cover a predetermined region of the a-Si layer 204, for example, the P-channel transistor formation region A.

Figure 4B:
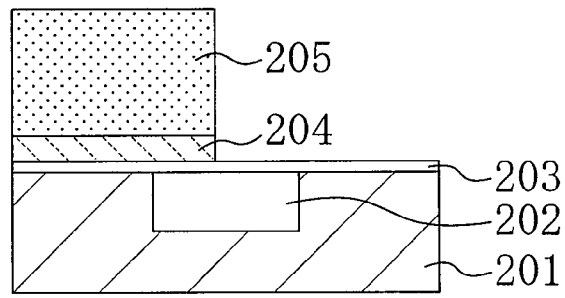

Next, as shown in FIG. 4B, only a part of the a-Si layer 204 is selectively etched away using the resist pattern 205 as a mask.

Figure 4C:
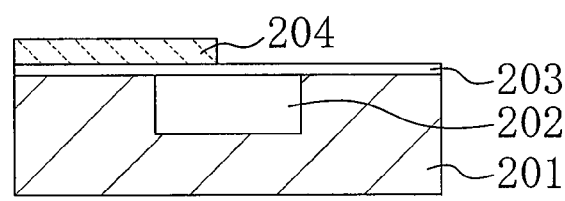

Next, as shown in FIG. 4C, the resist pattern 205 is removed.

Figure 4D:
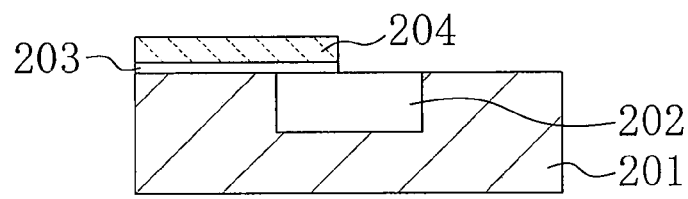

Next, as shown in FIG. 4D, a part of the insulating film 203 made of $SiO_x$ is selectively etched away using the a-Si layer 204 as a mask.

Figure 5A:
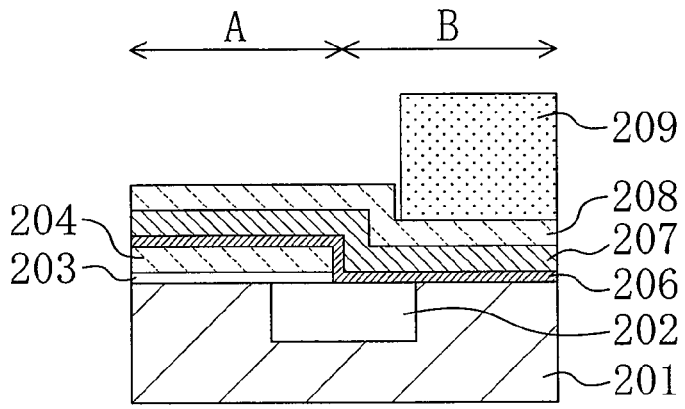
FIGS. 5A through 5D are cross-sectional views illustrating other essential process steps in the fabrication method for a semiconductor device according to the second embodiment of the present invention in a sequential order.

Next, as shown in FIG. 5A, a high-k insulating film 206, a metal film 207 and an a-Si layer 208 are sequentially deposited on the entire silicon substrate 201 region. This metal film 207 is composed of a metal having a work function close to the edge of the conduction band (CB) of silicon like the first embodiment. Subsequently, a resist pattern 209 is formed to cover the N-channel transistor formation region B.

Figure 5B:
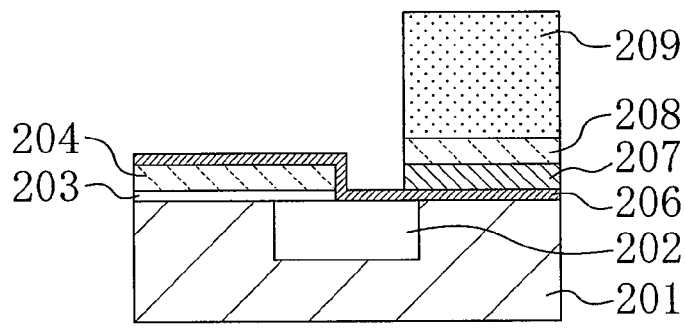

Next, as shown in FIG. 5B, the a-Si layer 208 and the metal film 207 are partially etched away using the resist pattern 209 as a mask. In this process step, for the etching of the a-Si layer 208, the conditions ensuring that the a-Si layer 208 is given a higher etching selectivity than the underlying metal film 207 are used. Furthermore, also for the etching of the metal film 207, the conditions ensuring that the metal film 207 is given a higher etching selectivity than the underlying high-k insulating film 206.

Figure 5C:
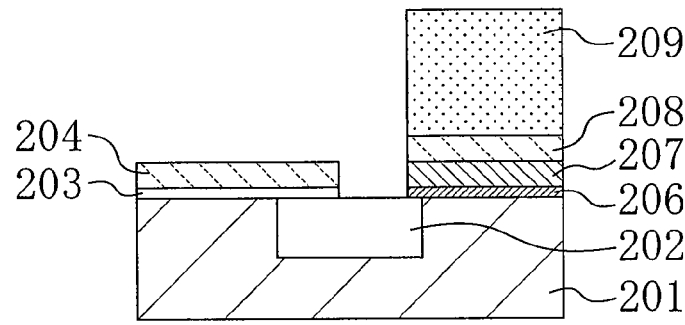

Next, as shown in FIG. 5C, the high-k insulating film 206 is partially etched away using the resist pattern 209 as a mask.

Figure 5D:
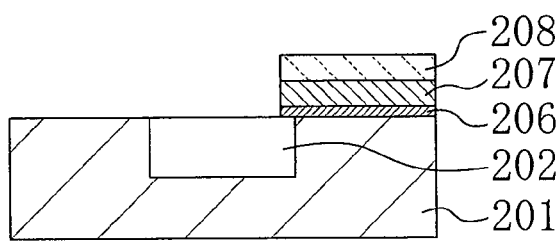

Next, as shown in FIG. 5D, the a-Si layer 204 is etched away using the resist pattern 209 as a mask. Although, in the above-mentioned etching of the high-k insulating film 206, the conditions ensuring that the high-k insulating film 206 is given a higher etching selectivity than the underlying a-Si layer 204 are used, the underlying a-Si layer 204 may have been partially cut away within its thickness in the above-mentioned etching. In etching the a-Si layer 204, the conditions ensuring that the a-Si layer 204 is given a higher etching selectivity than the underlying insulating film 203 of $SiO_2$ are used. Subsequently, the resist pattern 209 is removed, and then the insulating film 203 of $SiO_2$ is etched away. The same conditions as those for the etching of the a-Si layer 104 in the first embodiment can be applied to the etching of the a-Si layer 204 in this process step. However, since, in this embodiment, the underlying insulating film 203 made of a silicon oxide film is also finally etched away, the etching conditions in this embodiment are relaxed as compared with those in the first embodiment.

Figure 6A:
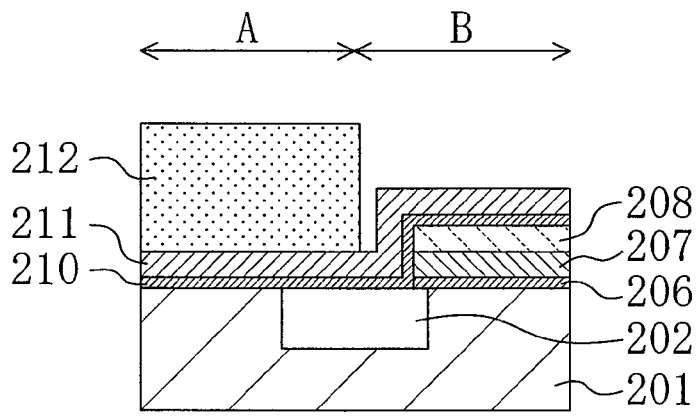
FIGS. 6A through 6D are cross-sectional views illustrating still other essential process steps in the fabrication method for a semiconductor device according to the second embodiment of the present invention in a sequential order.

Next, as shown in FIG. 6A, a high-k insulating film 210 is deposited on the entire silicon substrate 201 region, and then a metal film 211 is further deposited thereon. This metal film 211 has a work function close to the valence band edge. Subsequently, a resist pattern 212 is formed to cover the P-channel transistor formation region A.

Figure 6B:
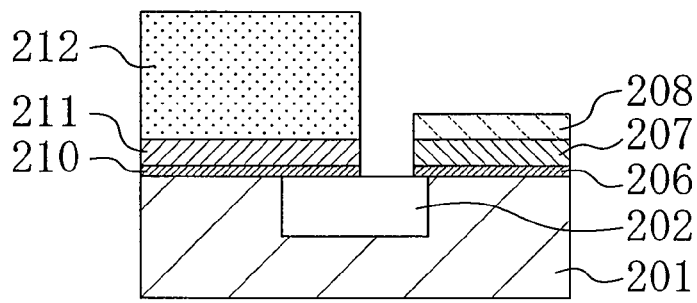

Next, as shown in FIG. 6B, a part of the metal film 211 and a part of the high-k insulating film 210 are sequentially etched away using the resist pattern 212 as a mask. This etching of the metal film 211 is carried out under the conditions ensuring that the metal film 211 is given a higher etching selectivity than the underlying high-k insulating film 210. The above-described etching of the high-k insulating film 210 is also carried out likewise under the conditions ensuring that the high-k insulating film 210 is given a higher etching selectivity than the underlying a-Si layer 208. However, the underlying a-Si layer 208 may be partially cut away within its thickness.

Figure 6C:
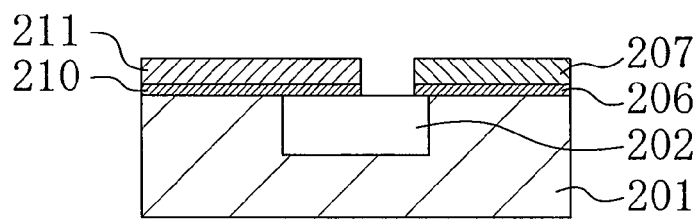

Next, as shown in FIG. 6C, the a-Si layer 208 is etched away using the resist pattern 212 as a mask, and then the resist pattern 212 is removed. The thicknesses of the deposited metal films 207 and 211, the amount of the deposited metal film 207 overetched, and other elements are adjusted such that immediately after completion of this process step, the difference in height between the P-channel transistor formation region A and the N-channel transistor formation region B becomes 10 nm or less.

Figure 6D:
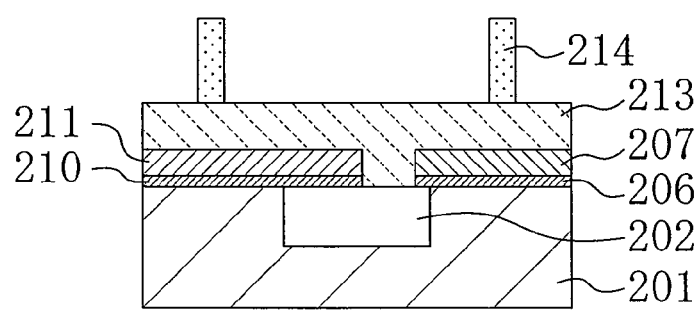

Next, as shown in FIG. 6D, an a-Si layer 213 is deposited on the entire silicon substrate 201 region, and then resist patterns 214 for forming gate patterns are formed on the P-channel transistor formation region A and the N-channel transistor formation region B.

Figure 7:
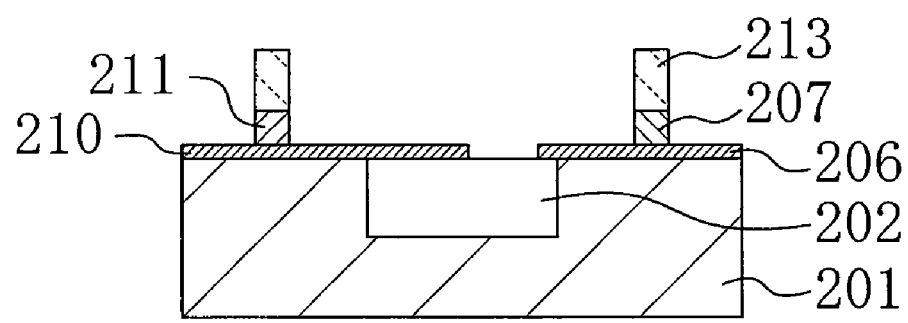
FIG. 7 is a cross-sectional view illustrating another essential process step in the fabrication method for a semiconductor device according to the second embodiment of the present invention.

Next, as shown in FIG. 7, the a-Si layer 213 and the metal films 211 and 207 are etched using the resist patterns 214 as masks, and then the resist patterns 214 are removed.

In this way, a dual metal gate structure in which each of gates has a work function suitable for an associated one of the P-channel transistor formation region A and the N-channel transistor formation region B is completed.

As described above, according to the fabrication method for a semiconductor device of the second embodiment of the present invention, high-k insulating films (210, 206) are separately formed on the P-channel transistor formation region A and the N-channel transistor formation region B. Therefore, the film configuration most suitable for each of the P-channel and N-channel transistor formation regions A and B can be achieved. Furthermore, since high-k insulating films (210, 206) are formed one after the other, there is no possibility of forming a defective gate insulating film due to plasma or wet etching.

Also in this embodiment, the order of the process flow (whether the P-channel transistor formation region A or the N-channel transistor formation region B is initially fabricated), an alternative material of the a-Si layers, and other elements are no different from those in the first embodiment. A material of the high-k insulating films (206, 210) is also no different from that of the high-k insulating film (103) described in the first embodiment, and a material of the metal films (207, 211) are also no different from that of the metal films (106, 109) described in the first embodiment.

Moreover, in this embodiment, the thickness and the like of the meal films 106 and 109 are adjusted so that the difference in height between the P-channel transistor formation region A and the N-channel transistor formation region B becomes 10 nm or less. Alternatively, in the case where difference in etching rate between the region A and the region B is observed in gate processing etching for forming the transistors, the heights may be changed within the range capable of correcting the difference.

EMBODIMENT 3

A fabrication method for a semiconductor device according to a third embodiment of the present invention will be described hereinafter with reference to the drawings.

FIGS. 8A through 8D and 9A through 9C are cross-sectional views for explaining essential process steps of the fabrication method for a semiconductor device according to the third embodiment of the present invention in a sequential order. It is assumed that in each figure, the left half region of the cross-sectional view when viewed from the front of the paper is a P-channel transistor formation region A and the right half region of the cross-sectional view when viewed from the front of the paper is an N-channel transistor formation region B.

Figure 8A:
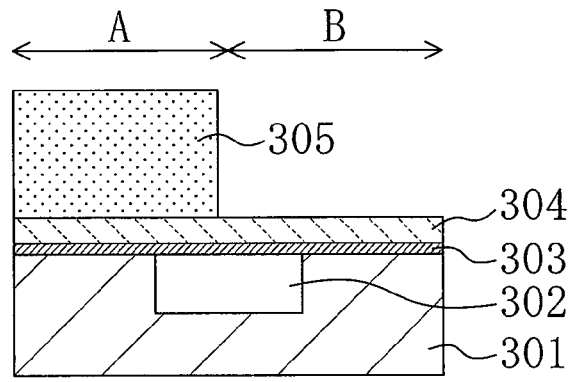
FIGS. 8A through 8D are cross-sectional views illustrating essential process steps in a fabrication method for a semiconductor device according to a third embodiment of the present invention in a sequential order.

First, as shown in FIG. 8A, a shallow trench isolation (STI) region 302 is formed in a silicon substrate 301 to define element formation regions, and then a high-k insulating film 303 made of, for example, $HfO_x$ is formed to cover the silicon substrate 301 and the STI region 302. Subsequently, an a-Si layer 304 is formed on the high-k insulating film 303. Next, a resist pattern 305 is formed to cover a predetermined region of the a-Si layer 304, for example, the P-channel transistor formation region A.

Figure 8B:
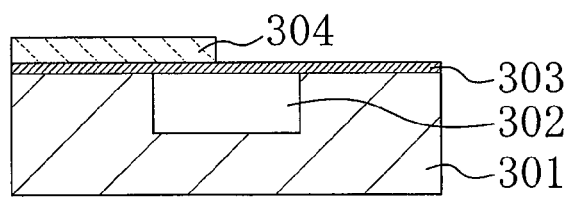

Next, as shown in FIG. 8B, the a-Si layer 304 is partially etched away using the resist pattern 305 as a mask, and then the resist pattern 305 is removed.

Figure 8C:
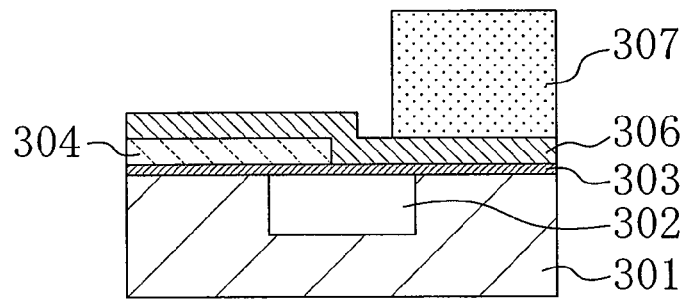

Next, as shown in FIG. 8C, a metal film 306 having a work function close to the conduction band edge is deposited on the entire silicon substrate 301 region, and then a resist pattern 307 is formed to cover the N-channel transistor formation region B. The range of the work function of the metal film 306 is similar to that described for the above-described metal film 106 in the first embodiment.

Figure 8D:
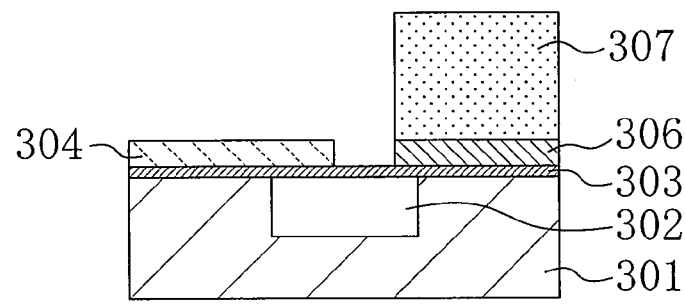

Next, as shown in FIG. 8D, the metal film 306 is partially etched away using the resist pattern 307 as a mask.

Figure 9A:
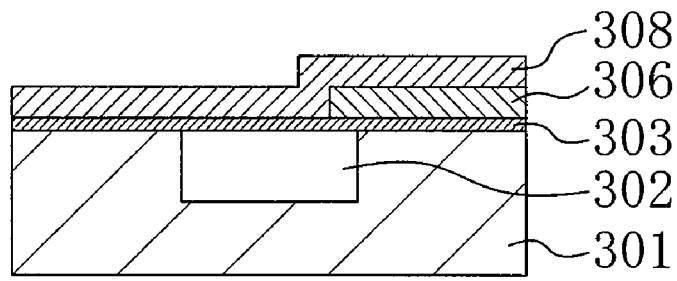
FIGS. 9A through 9C are cross-sectional views illustrating other essential process steps in the fabrication method for a semiconductor device according to the third embodiment of the present invention in a sequential order.

Next, as shown in FIG. 9A, the a-Si layer 304 is etched away with selectivity to the underlying high-k insulating film 303, and then the resist pattern 307 is removed. The conditions for this etching are also similar to those for the etching of the a-Si layer 104 in the first embodiment. Subsequently, a metal film 308 having a work function close to the valence band edge is deposited on the entire silicon substrate 301 region.

Figure 9B:
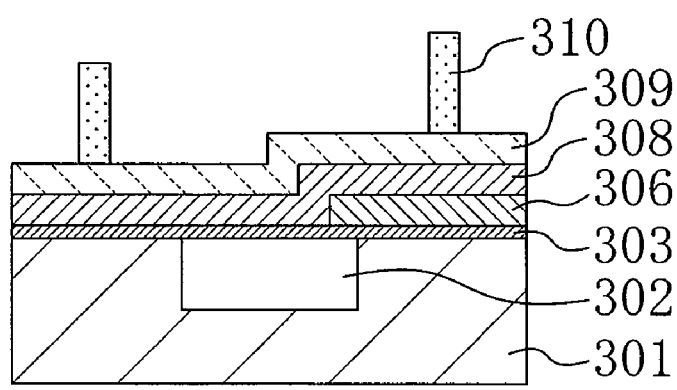

Next, as shown in FIG. 9B, an a-Si layer 309 is deposited to cover the metal film 308, and then resist patterns 310 serving as gate masks are formed on the a-Si layer 309.

Figure 9C:
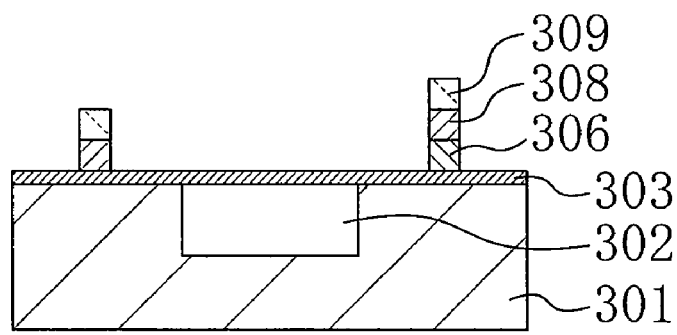

Next, as shown in FIG. 9C, the a-Si layer 309 and the metal films 308 and 306 are partially etched away using the resist patterns 310 as masks, and then the resist patterns 310 are removed. For this etching of the a-Si layer 309, like the first embodiment, the last step of this etching process is executed using a gas containing halogen under conditions that the direct-current voltage (Vdc) has been reduced, thereby improving the quality of the high-k insulating film.

As described above, according to the fabrication method for a semiconductor device of the third embodiment of the present invention, the height of a gate electrode for the N-channel transistor formation region A is essentially different from that for the P-channel transistor formation region B. However, only two mask process steps except for gate processing are advantageously needed.

Also in this embodiment, the order of the process flow (whether the P-channel transistor formation region A or the N-channel transistor formation region B is initially fabricated), an alternative material of the a-Si layers, and other elements are no different from those in the first embodiment. A material of the high-k insulating film (303) is also no different from that of the high-k insulating film (103) described in the first embodiment, and a material of the metal films (306, 308) is also no different from that of the metal films (106, 109) described in the first embodiment.

EMBODIMENT 4

A fabrication method for a semiconductor device according to a fourth embodiment of the present invention will be described hereinafter with reference to the drawings.

FIGS. 10A through 10D and 11A through 11C are cross-sectional views for explaining essential process steps in the fabrication method for a semiconductor device according to the fourth embodiment of the present invention in a sequential order. It is assumed that in each figure, the left half region of the cross-sectional view when viewed from the front of the paper is a P-channel transistor formation region A and the right half region of the cross-sectional view when viewed from the front of the paper is an N-channel transistor formation region B.

Figure 10A:
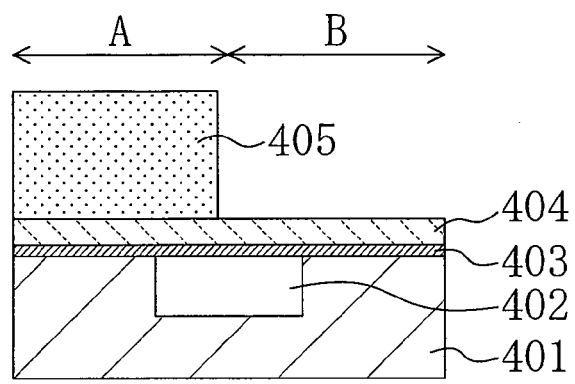
FIGS. 10A through 10D are cross-sectional views illustrating essential process steps in a fabrication method for a semiconductor device according to a fourth embodiment of the present invention in a sequential order.

First, as shown in FIG. 10A, a shallow trench isolation (STI) region 402 is formed in a silicon substrate 401 to define element formation regions, and then a high-k insulating film 403 made of, for example, $HfO_x$ is formed to cover the silicon substrate 401 and the STI region 402. Subsequently, an a-Si layer 404 is formed on the high-k insulating film 403. Next, a resist pattern 405 is formed to cover a predetermined region of the a-Si layer 404, for example, the P-channel transistor formation region A.

Figure 10B:
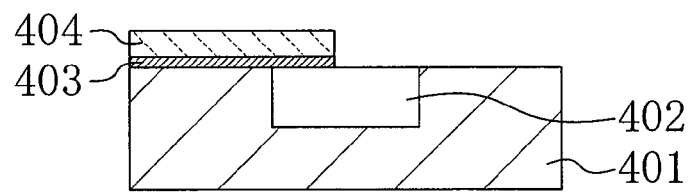

Next, as shown in FIG. 10B, the a-Si layer 404 is partially etched away with selectivity to the underlying high-k insulating film 403 by using the resist pattern 405 as a mask, and then the high-k insulating film 403 is further partially etched away. Thereafter, the resist pattern 405 is removed.

Figure 10C:
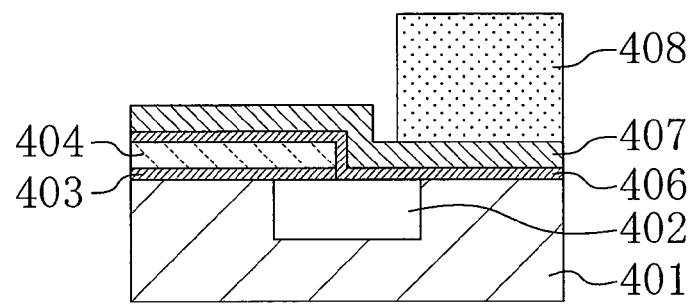

Next, as shown in FIG. 10C, a high-k insulating film 406 is deposited on the entire silicon substrate 401 region, and subsequently a metal film 407 having a work function close to the conduction band edge is deposited thereon. Thereafter, a resist pattern 408 is formed to cover a region of the metal film 407 corresponding to the N-channel transistor formation region B. The range of the work function of the metal film 407 is similar to that of the metal film 106 in the first embodiment.

Figure 10D:
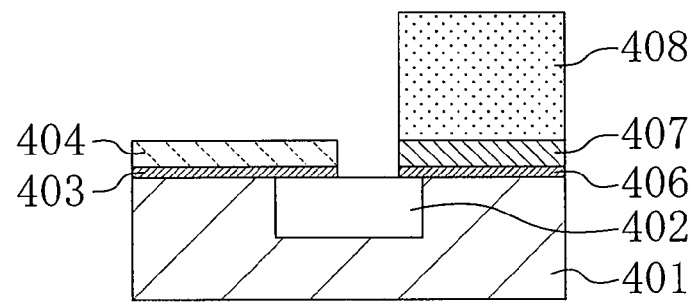

Next, as shown in FIG. 10D, the metal film 407 is partially etched away using the resist pattern 408 as a mask, and subsequently the high-k insulating film 406 is partially etched away.

Figure 11A:
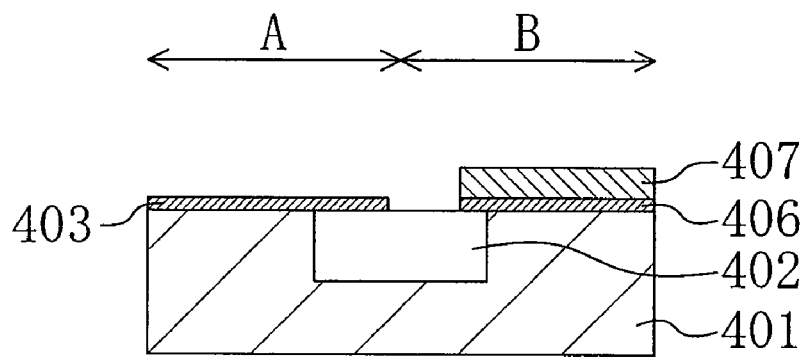
FIGS. 11A through 11C are cross-sectional views illustrating other essential process steps in the fabrication method for a semiconductor device according to the fourth embodiment of the present invention in a sequential order.

Next, as shown in FIG. 11A, the a-Si layer 404 is etched with selectivity to the underlying high-k insulating film 403. This etching is performed under the same conditions as those for the etching of the a-Si layer 106 in the first embodiment. The applied bias voltage is set at 50 V or less, thereby improving the quality of the high-k insulating film 403 without etching the high-k insulating film 403. Thereafter, the resist pattern 408 is removed.

Figure 11B:
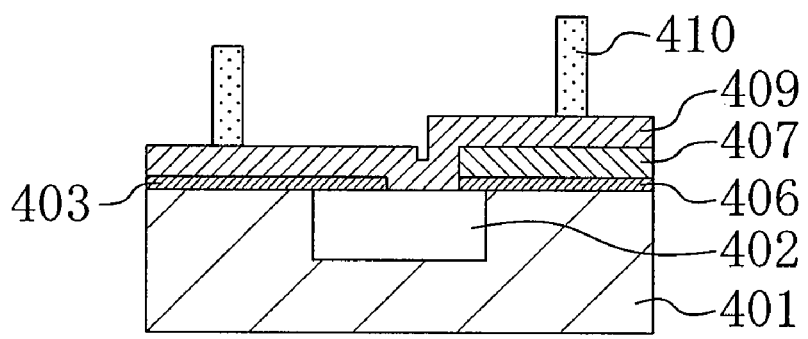

Next, as shown in FIG. 11B, a metal film 409 having a work function close to the valence band edge is deposited on the entire silicon substrate 401 region, and then resist patterns 410 serving as gate masks are formed.

Figure 11C:
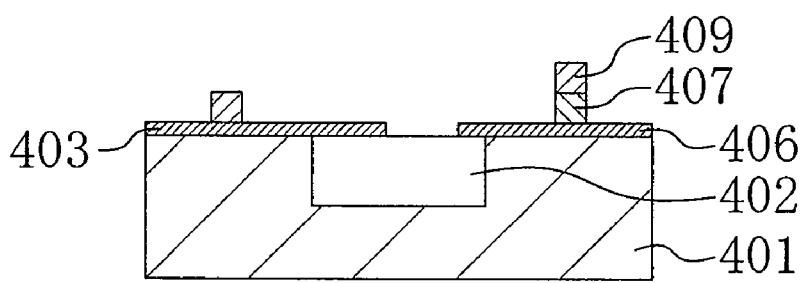

Next, as shown in FIG. 11C, the metal films 409 and 407 are partially etched away using the resist patterns 410 as masks, and then the resist patterns 410 are removed. In this way, a dual metal gate structure in which each of gates has a work function suitable for an associated one of the P-channel transistor formation region A and the N-channel transistor formation region B is completed. Alternatively, the resist pattern 410 as a gate mask may be formed after deposition of an a-Si layer on the metal film 409, as in the third embodiment.

As described above, according to the fabrication method for a semiconductor device of the fourth embodiment of the present invention, high-k insulating films (403, 406) are separately formed on the P-channel transistor formation region A and the N-channel transistor formation region B. Therefore, the film configuration suitable for each of the P-channel and N-channel transistor formation regions A and B can be achieved. Furthermore, the quality of a film on one transistor formation region (the P-channel transistor formation region in the above-described embodiment) can be advantageously improved simultaneously with an etching process, and in addition, only two mask process steps are advantageously needed.

Also in this embodiment, the order of the process flow (whether the P-channel transistor formation region A or the N-channel transistor formation region B is initially fabricated), an alternative material of the a-Si layers, and other elements are no different from those in the first embodiment. A material of the high-k insulating films (403, 406) is also no different from that of the high-k insulating film (103) described in the first embodiment, and a material of the metal films (407, 409) is also no different from that of the metal films (106, 109) described in the first embodiment.

EMBODIMENT 5

A fabrication method for a semiconductor device according to a fifth embodiment of the present invention will be described hereinafter with reference to the drawings.

FIGS. 12A through 12D, 13A through 13D, and 14A through 14D are cross-sectional views for explaining essential process steps in the fabrication method for a semiconductor device according to the fifth embodiment of the present invention in a sequential order. It is assumed that in each figure, the left half region of the cross-sectional view when viewed from the front of the paper is a P-channel transistor formation region A and the right half region of the cross-sectional view when viewed from the front of the paper is an N-channel transistor formation region B.

Hereinafter, in this embodiment, an example in which the present invention is applied to a gate-last process (damascene gate process) will be described.

Figure 12A:
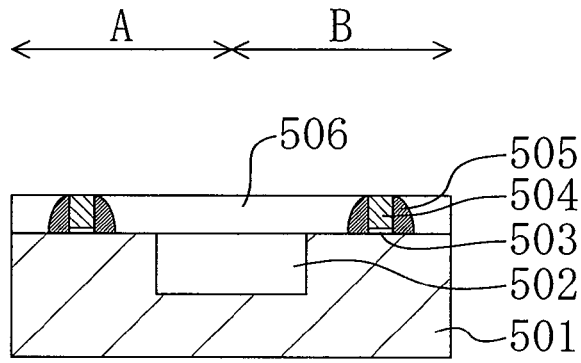
FIGS. 12A through 12D are cross-sectional views illustrating essential process steps in a fabrication method for a semiconductor device according to a fifth embodiment of the present invention in a sequential order.

First, as shown in FIG. 12A, through an usually used LSI fabrication process, a shallow trench isolation (STI) region 502 is formed in a silicon substrate 501 to define element formation regions, and silicon oxide films 503, polysilicon films 504, sidewalls 505, and a premetal dielectric (PMD) film 506 are formed on the silicon substrate 501.

Figure 12B:
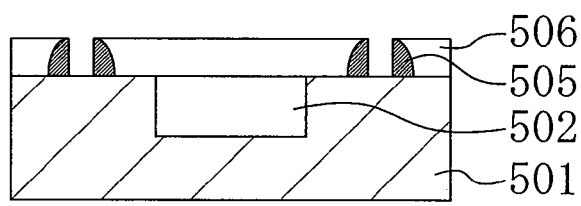

Next, as shown in FIG. 12B, the polysilicon films 504 are selectively removed by wet etching, and then the silicon oxide films 503 are further removed. The following chemical solutions are used for the above-mentioned wet etching. That is, an alkaline solution, such as $NH_4OH$, is used for the removal of the polysilicon films 504, and a HF-based solution is used for the removal of the silicon oxide films 503.

Figure 12C:
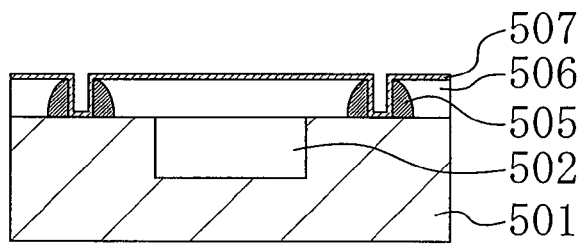

Next, as shown in FIG. 12C, a high-k insulating film 507 is deposited on the entire silicon substrate 501 region.

Figure 12D:
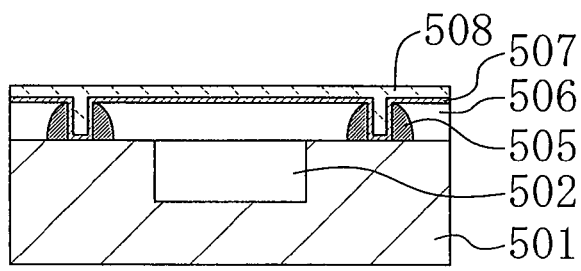

Next, as shown in FIG. 12D, an a-Si layer 508 is deposited on the entire silicon substrate 501 region and then etched back so as to expose the top surface of the PMD film 506 and be left only in gate formation regions of the PMD film 506.

Figure 13A:
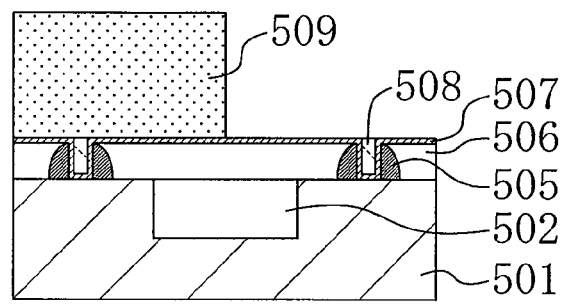
FIGS. 13A through 13D are cross-sectional views illustrating other essential process steps in the fabrication method for a semiconductor device according to the fifth embodiment of the present invention in a sequential order.

Next, as shown in FIG. 13A, a resist pattern 509 is formed to cover the P-channel transistor formation region A.

Figure 13B:
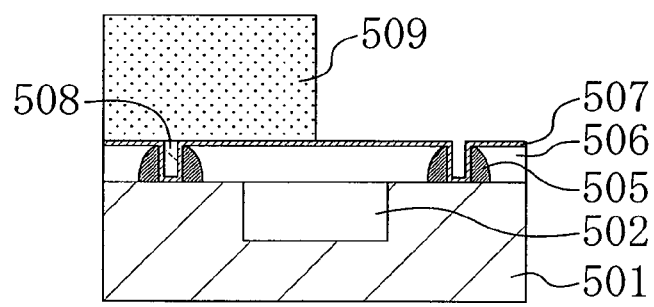

Next, as shown in FIG. 13B, the part of the a-Si layer 508 left in a trench in the gate formation region for the N-channel transistor formation region B is removed with selectivity to the underlying high-k insulating film 507 by dry etching using the resist pattern 509 as a mask. The conditions for this dry etching are similar to those for the etching of the a-Si layer 104 in the first embodiment.

Figure 13C:
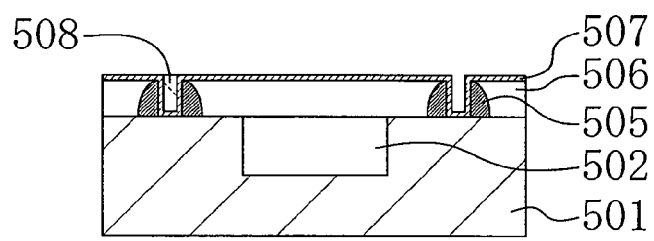

Next, as shown in FIG. 13C, the resist pattern 509 is removed.

Figure 13D:
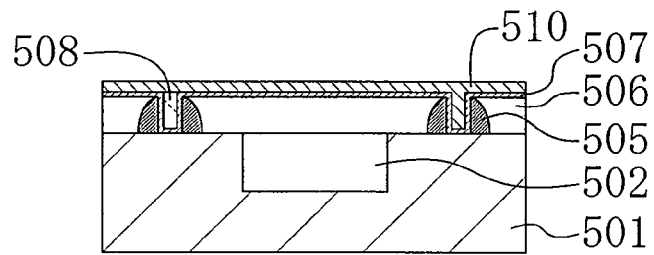

Next, as shown in FIG. 13D, a metal film 510 having a work function close to the conduction band edge is deposited. The range of the work function of the metal film 510 is similar to that of the metal film 106 in the first embodiment.

Figure 14A:
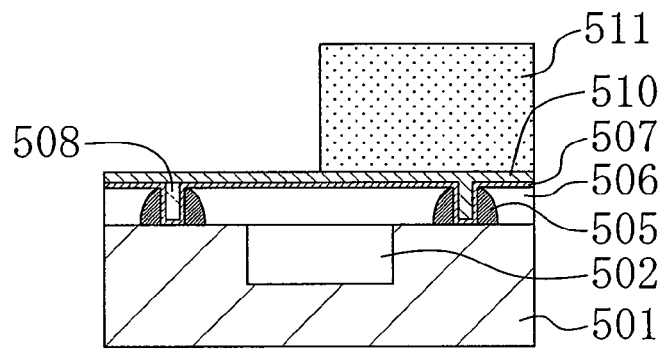
FIGS. 14A through 14D are cross-sectional views illustrating still other essential process steps in the fabrication method for a semiconductor device according to the fifth embodiment of the present invention in a sequential order.

Next, as shown in FIG. 14A, a resist pattern 511 is formed to cover a region of the metal film 510 corresponding to the N-channel transistor formation region B.

Figure 14B:
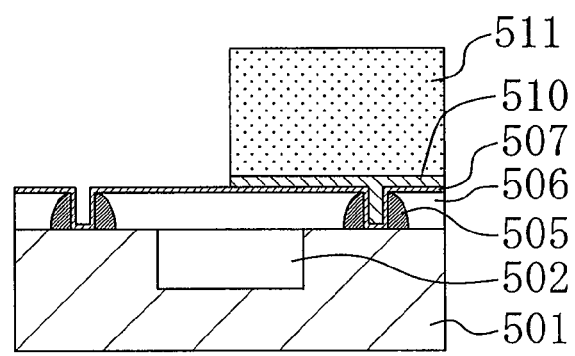

Next, as shown in FIG. 14B, the metal film 510 is partially removed by etching using the resist pattern 511 as a mask, and subsequently the part of the a-Si layer 508 left in a trench in the gate formation region for the P-channel transistor formation region A is removed with selectivity to the underlying high-k insulating film 507.

Figure 14C:
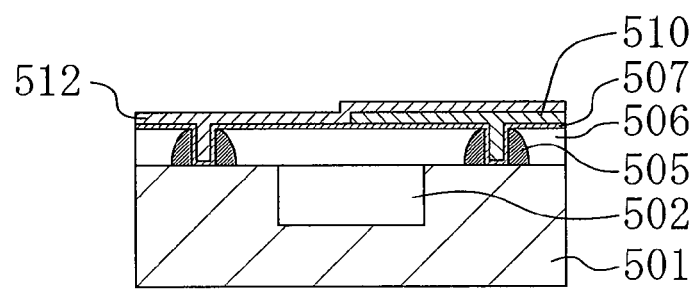

Next, as shown in FIG. 14C, the resist pattern 511 is removed, and then a metal film 512 having a work function close to the valence band edge is deposited on the entire silicon substrate 501 region. The range of the work function of the metal film 512 is similar to that of the metal film 109 in the first embodiment.

Figure 14D:
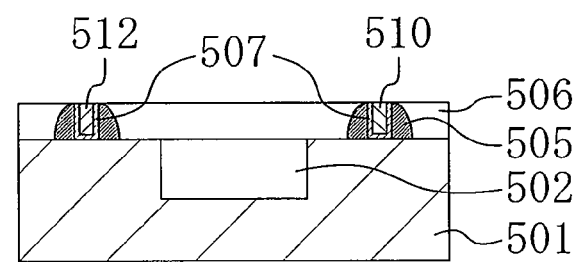
Figure 15A:
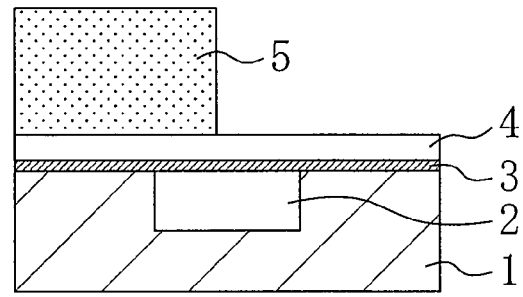
FIGS. 15A through 15D are cross-sectional views illustrating essential process steps in a known fabrication method for a semiconductor device in a sequential order.
Figure 15B:
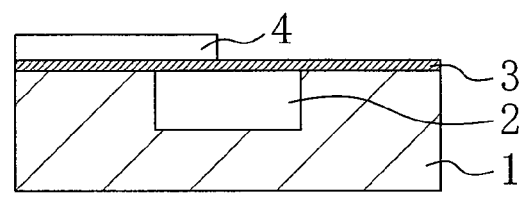
Figure 15C:
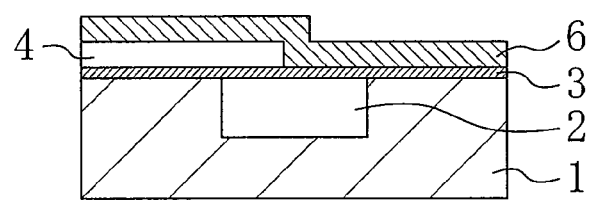
Figure 15D:
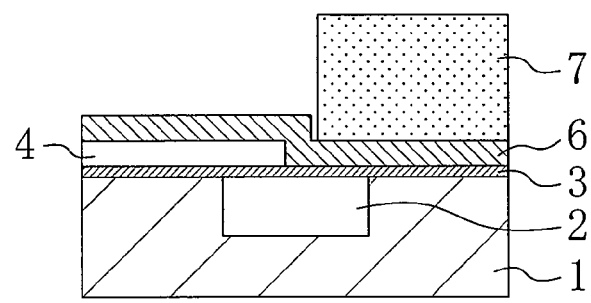
Figure 16A:
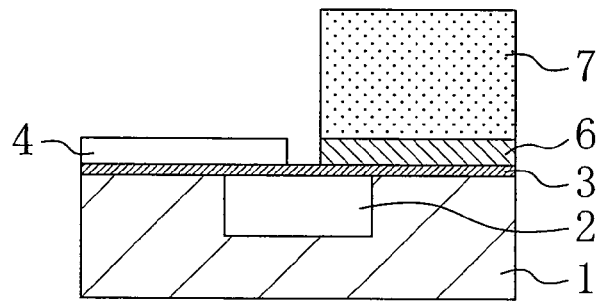
FIGS. 16A through 16D are cross-sectional views illustrating other essential process steps in the known fabrication method for a semiconductor device in a sequential order.
Figure 16B:
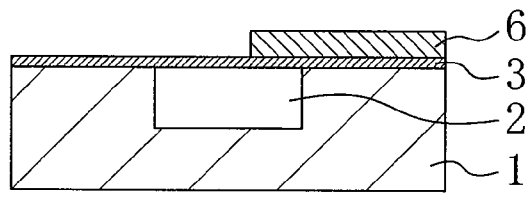
Figure 16C:
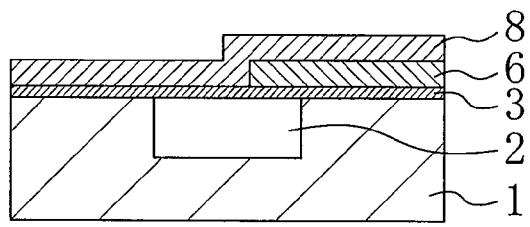
Figure 16D:
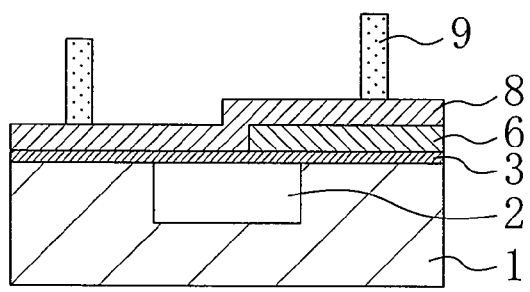
Figure 17A:
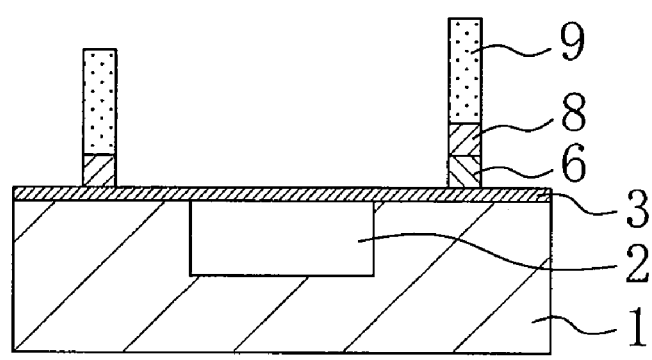
FIGS. 17A and 17B are cross-sectional views illustrating still other essential process steps in the known fabrication method for a semiconductor device in a sequential order.
Figure 17B:
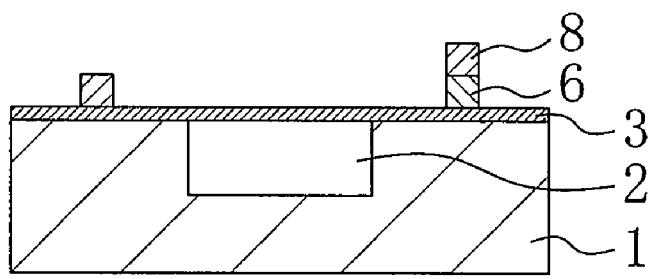

Next, as shown in FIG. 14D, parts of the metal films 510 and 512 and high-k insulating film 507 all left on the PMD film 506 are removed by chemical mechanical polishing (CMP), thereby leaving the high-k insulating film 507 and the metal films 510 and 512 only in the trenches in the gate formation regions for both P-channel transistor formation region A and the N-channel transistor formation region B. Through the above-mentioned series of process steps, a dual metal gate structure is formed using the gate-last process.

As described above, according to the fabrication method for a semiconductor device of the fifth embodiment of the present invention, even when the present invention is applied to the gate-last process, gate electrodes of an N-channel transistor and a P-channel transistor having separate work functions can be formed while the quality of a high-k insulating film is improved by plasma treatment using a halogen gas in removal of buffer layers made of a-Si layers.

The fabrication method according to this embodiment may be modified as a fabrication method according to a modification of this embodiment in the following manner. In the above-described step shown in FIG. 12A, high-k insulating films may be used instead of the silicon oxide films 503, and a-Si layers may be used instead of the polysilicon films 504. Thereafter, only one of the a-Si layers located on the N-channel transistor formation region B may be removed, and the metal film 508 may be deposited on the entire surface region of the silicon substrate 501. Thereafter, a part of the metal film 508 on the P-channel transistor formation region A and the other a-Si layer may be removed, and then the metal film 510 may be formed to cover the P-channel transistor formation region A. In view of the above, gate electrodes of an N-channel transistor and a P-channel transistor having separate work functions can be formed while the quality of a high-k insulating film is improved by plasma treatment using a halogen gas in removal of buffer layers made of a-Si layers.

Also in this embodiment, the order of the process flow (whether the P-channel transistor formation region A or the N-channel transistor formation region B is initially fabricated), an alternative material of the a-Si layers, and other elements are no different from those in the first embodiment. A material of the high-k insulating film (507) is also no different from that of the high-k insulating film (103) described in the first embodiment, and a material of the metal films (510, 512) is also no different from that of the metal films (106, 109) described in the first embodiment.

Although the present invention was described above with reference to the first through fifth embodiments and FIGS. 1 through 14D attached to this specification, the technical scope of the present invention is not limited to the scope described in the above-described embodiments and the drawings. Various changes or modifications may be made to the above-described embodiments within the technical scope of the present invention. It is apparent from the specification, the drawings and the description of claims that such changes or modifications can be included in the technical scope of the present invention.

As described above, the present invention is useful for fabrication methods for a semiconductor device having a dual metal gate structure in which metal electrodes of an N-channel transistor and a P-channel transistor have separate work functions.

What is claimed is:

1. A method for fabricating a semiconductor device having first and second regions, transistors of different conductivity types being formed on parts of a substrate corresponding to the first and second regions, the method comprising the steps of:
    (a) forming a first insulating film to cover the parts of the substrate corresponding to the first and second regions;
    (b) forming a first thin film on the first insulating film, the first thin film having a relatively higher etching rate than the first insulating film in plasma etching using a halogen gas;
    (c) removing a part of the first thin film corresponding to the first region by the plasma etching using a mask covering the second region and modifying a part of the first insulating film corresponding to the first region;
    (d) after the step (c), forming a first metal film having a first work function to cover the first and second regions;
    (e) removing a part of the first metal film corresponding to the second region by etching using a mask covering the first region;
    (f) after the step (e), removing a part of the first thin film corresponding to the second region by the plasma etching using the mask covering the first region and modifying a part of the first insulating film corresponding to the second region;
    (g) forming a second metal film having a second work function on the part of the first insulating film corresponding to the second region;
    (h) between the steps (d) and (e), forming a second thin film on the first metal film, the second thin film having a relatively higher etching rate than the first metal film, and
    (i) removing a part of the second thin film corresponding to the second region by etching using the mask covering the first region.

2. The method of claim 1, wherein the plasma etching includes a step of performing etching under conditions that a RF bias is prevented from being applied to the substrate.

3. The method of claim 1, wherein the first insulating film is a high dielectric insulating film.

4. The method of claim 1, wherein the first insulating film contains Hf.

5. The method of claim 1, wherein the first and second work functions fall within 300 mV from the valence band level or conduction band potential of silicon.

6. The method of claim 1, wherein the difference in height between a gate electrode of a transistor formed on the first region and a gate electrode of a transistor formed on the second region is equal to or less than 10 nm.

7. The method of claim 1, wherein the first thin film is made of amorphous silicon, polysilicon, or SiN deposited at 600° C. or less.

8. The method of claim 1, wherein the first thin film contains an N-type impurity.

9. A method for fabricating a semiconductor device having first and second regions, transistors of different conductivity types being formed on parts of a substrate corresponding to the first and second regions, the method comprising the steps of:
    (a) forming a first insulating film to cover the parts of the substrate corresponding to the first and second regions;
    (b) forming a first thin film on the first insulating film;
    (c) removing parts of the first thin film and first insulating film both corresponding to the first region by etching using a mask covering the second region;
    (d) forming a second insulating film to cover the part of the substrate corresponding to the first region and a part of the first thin film corresponding to the second region;
    (e) forming a first metal film having a first work function to cover the second insulating film;
    (f) forming a second thin film having a relatively higher etching rate than the first metal film to cover the first metal film;
    (g) removing a part of the second thin film corresponding to the second region by etching using a mask covering the first region;
    (h) after the step (g), removing a part of the first metal film corresponding to the second region by etching using the mask covering the first region;
    (i) after the step (h), removing a part of the second insulating film corresponding to the second region by etching using the mask covering the first region;
    (j) after the step (i), removing a part of the first thin film corresponding to the second region by etching using the mask covering the first region;
    (k) after the step (j), removing a part of the first insulating film corresponding to the second region by etching the mask covering the first region;
    (l) after the step (k), forming a third insulating film to cover a part of the first thin film corresponding to the first region and the part of the substrate corresponding to the second region;
    (m) forming a second metal film having a second work function to cover the third insulating film;
    (n) removing a part of the second metal film corresponding to the first region by etching using a mask covering the second region; and
    (o) after the step (n), removing a part of the third insulating film corresponding to the first region by etching using the mask covering the second region.

10. The method of claim 9, wherein the second insulating film is a high dielectric insulating film.

11. The method of claim 9, wherein the second insulating film contains Hf.

12. A method for fabricating a semiconductor device having first and second regions, transistors of different conductivity types being formed on parts of a substrate corresponding to the first and second regions, the method comprising the steps of:
   (a) forming a first insulating film to cover the parts of the substrate corresponding to the first and second regions;
   (b) forming a first thin film on the first insulating film, the first thin film having a relatively higher etching rate than the first insulating film in plasma etching using a halogen gas; and
   (c) removing parts of the first thin film and first insulating film both corresponding to the first region by etching using a mask covering the second region;
   (d) forming a second insulating film to cover the part of the substrate corresponding to the first region and a part of the first thin film corresponding to the second region;
   (e) forming a first metal film having a first work function to cover the second insulating film;
   (f) removing respective parts of the first metal film and the second insulating film corresponding to the second region by etching using a mask covering the first region;
   (g) after the step (f), removing a part of the first thin film corresponding to the second region by the plasma etching using the mask covering the first region and modifying a part of the first insulating film corresponding to the second region; and
   (h) forming a second metal film having a second work function to cover a part of the first insulating film corresponding to the second region.

13. A method for fabricating a semiconductor device having first and second regions, transistors of different conductivity types being formed on parts of a substrate corresponding to the first and second regions, the method comprising the steps of:
   (a) forming first thin films on the inside of a first gate formation trench corresponding to the first region, formed at the bottom with a first insulating film and the inside of a second gate formation trench corresponding to the second region, formed at the bottom with another first insulating film, the first thin films having a relatively higher etching rate than the first insulating films in plasma etching using a halogen gas;
   (b) removing one of the first thin films corresponding to the first region by the plasma etching using a mask covering the second region to expose the associated first insulating film at the first gate formation trench and modifying the first insulating film;
   (c) after the step (b), forming a first metal film having a first work function to cover the first region including the inside of the first gate formation trench and the second region;
   (d) after the step (c), removing a part of the first metal film corresponding to the second region by etching using a mask covering the first region;
   (e) after the step (d), removing the other first thin film corresponding to the second region by the plasma etching using the mask covering the first region to expose the associated first insulating film at the second gate formation trench and modifying the first insulating film; and
   (f) after the step (e), forming a second metal film having a second work function to cover the second region including the inside of the second gate formation trench.

14. A method for fabricating a semiconductor device having first and second regions, transistors of different conductivity types being formed on parts of a substrate corresponding to the first and second regions, the method comprising the steps of:
   (a) forming first and second gate formation trenches exposing parts of the substrate in parts corresponding to the first and second regions, respectively;
   (b) after the step (a), forming a first insulating film to cover the first region including the inside of the first gate formation trench and the second region including the inside of the second gate formation trench, forming a first thin film having a relatively higher etching rate than the first insulating film in plasma etching using a halogen gas to cover the first gate insulating film, and then partially leaving the first thin film only inside the first and second gate formation trenches;
   (c) after the step (b), removing the left part of the first thin film in the first gate formation trench by the plasma etching and modifying a part of the first insulating film inside the first gate formation trench;
   (d) after the step (c), forming a first metal film having a first work function to cover the first region including the inside of the first gate formation trench and the second region;
   (e) after the step (d), removing a part of the first metal film corresponding to the second region by etching using a mask covering the first region;
   (f) after the step (e), removing the left part of the first thin film in the second gate formation trench by the plasma etching using the mask covering the first region and modifying a part of the first insulating film inside the second gate formation trench; and
   (g) after the step (f), forming a second metal film having a second work function to cover the second region including the inside of the second gate formation trench.

* * * * *